(12) United States Patent
Cho et al.

(10) Patent No.: US 7,408,379 B2
(45) Date of Patent: Aug. 5, 2008

(54) IMPEDANCE CALIBRATION CIRCUIT AND SEMICONDUCTOR DEVICE INCLUDING THE SAME

(75) Inventors: Yong-Ki Cho, Seoul (KR); Mi-Jin Lee, Suwon-si (KR); Sung-Jinn Chung, Gwangmyeong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/853,956

(22) Filed: Sep. 12, 2007

(65) Prior Publication Data

US 2008/0143377 A1 Jun. 19, 2008

(30) Foreign Application Priority Data

Dec. 18, 2006 (KR) .................. 10-2006-0129653

(51) Int. Cl.
*H03K 17/16* (2006.01)
(52) U.S. Cl. .......................... 326/30; 326/83
(58) Field of Classification Search .................. 326/26, 326/27, 30, 82, 83
See application file for complete search history.

(56) References Cited

U.S. PATENT DOCUMENTS

| | | | | |
|---|---|---|---|---|
| 2003/0218477 A1* | 11/2003 | Jang et al. | ....................... | 326/30 |
| 2008/0001623 A1* | 1/2008 | Kim | ........................... | 326/30 |
| 2008/0048714 A1* | 2/2008 | Lee et al. | ....................... | 326/30 |
| 2008/0054981 A1* | 3/2008 | Hosoe et al. | ................. | 327/333 |
| 2008/0061818 A1* | 3/2008 | Santurkar et al. | .............. | 326/30 |

FOREIGN PATENT DOCUMENTS

| | | |
|---|---|---|
| KR | 1020040004792 A | 1/2004 |
| KR | 1020040021110 A | 3/2004 |
| KR | 1020050012931 A | 2/2005 |
| KR | 1020050019453 A | 3/2005 |

* cited by examiner

*Primary Examiner*—Don P Le
(74) *Attorney, Agent, or Firm*—Volentine & Whitt, PLLC

(57) ABSTRACT

An impedance calibration circuit and a semiconductor device including the same are provided. An embodiment of the invention provides an impedance calibration circuit with a variable reference voltage generation unit. The impedance calibration circuit maximizes the number of semiconductor devices that can be tested in test equipment at one time and permits the operation of an impedance matching unit (e.g., an on-die-termination (ODT) circuit and/or an off-chip-driver (OCD)) to be tested for a variety of reference resistor values.

20 Claims, 7 Drawing Sheets

IMPEDANCE CALIBRATION CIRCUIT AND SEMICONDUCTOR DEVICE INCLUDING THE SAME

CROSS-REFERENCE TO RELATED APPLICATION

This application claims the benefit of Korean Patent Application No. 10-2006-0129653, filed Dec. 18, 2006, the contents of which are hereby incorporated herein by reference in their entirety.

BACKGROUND OF THE INVENTION

1. Field of the Invention

The present invention relates to semiconductor devices and, more particularly, but not by way of limitation, to an impedance calibration circuit having an adjustable reference voltage generation unit.

2. Description of Related Art

In recent years, operating frequencies of semiconductor devices are showing a tendency to increase. Also, alternating-current (AC) characteristics associated with input and output signals, such as a data signal, are very important to high-frequency semiconductor devices. The AC characteristics are affected by the characteristics of a channel that connects two or more devices rather than a semiconductor device or a controller for controlling the semiconductor device. Thus, it is essential that semiconductor devices should be designed to improve channel characteristics.

In order to improve the channel characteristics, impedance matching is typically performed in a channel using an on-die-termination (ODT) circuit and an off-chip-driver (OCD) circuit. Specifically, in order to improve the channel characteristics, in a semiconductor device, an output signal is output through a data input/output terminal after passing through an OCD circuit having an output impedance that is adjusted to a predetermined impedance, while an input signal is input through the data input/output terminal after passing through an ODT circuit having an input impedance that is adjusted to a predetermined impedance.

The semiconductor device includes an impedance calibration circuit, which calibrates the impedance of an ODT circuit or an OCD circuit using an external reference resistor, in order to further improve the channel characteristics. The reference resistor used for impedance calibration may have various resistances according to systems or other circumstances in which the semiconductor device is used. An impedance calibration circuit for the ODT circuit or the OCD circuit may calibrate impedance therein in proportion to a reference resistance. Each of the ODT circuit and the OCD circuit receives information on the calibrated impedance from the impedance calibration circuit and adjusts impedance therein. Also, the operation of the impedance calibration circuit and the operation of the ODT circuit or the OCD circuit are necessarily tested in testing the semiconductor device.

FIG. 1 is a block diagram of a conventional impedance calibration circuit.

Referring to FIG. 1, the conventional impedance calibration circuit includes an impedance calibration unit 10, a comparison unit 20, a reference voltage generation unit 30, and an impedance matching unit 40. The impedance calibration unit 10 includes a variable impedance circuit 11 and a control code generator 13. The reference voltage generation unit 30 includes resistors R10 and R20 that are connected in series between a power supply voltage Vdd and a ground voltage. The impedance matching unit 40 includes two variable impedance circuits 41 and 43. In FIG. 1, reference character ZQ refers to an additional terminal used for impedance calibration, RQ refers to a reference resistor, and DQ1 refers to a data input/output terminal.

Functions of the respective blocks shown in FIG. 1 will now be described.

The impedance calibration unit 10 calibrates the calibration impedance therein (i.e., the impedance of the variable impedance circuit 11) in response to a control signal "con" output from the comparison unit 20 and outputs an impedance control code "code". The variable impedance circuit 11, which is connected between the power supply voltage Vdd and the terminal ZQ, may include a MOS array and has an impedance value corresponding to the impedance control code "code". The control code generator 13 varies the impedance control code "code" in response to the control signal "con" and outputs the varied code to the variable impedance circuit 11. After the impedance calibration operation is finished, the control code generator 13 outputs the impedance control code "code" to the impedance matching unit 40. The comparison unit 20 compares a voltage VZQ at the terminal ZQ with a reference voltage Vref and outputs the control signal "con" based on the comparison result. The reference voltage generation unit 30 outputs a predetermined reference voltage Vref. The impedance matching unit 40, which may be an ODT circuit or an OCD circuit, adjusts input/output impedance (i.e., the impedance of the variable impedance circuits 41 and 43) in response to the impedance control code "code". That is, when the impedance matching unit 40 is an ODT circuit, the ODT circuit terminates a signal input to the data input/output terminal DQ1 as the input/output impedance. Also, when the impedance matching unit 40 is an OCD circuit, the output impedance of the OCD circuit is adjusted as the input/output impedance. The variable impedance circuits 41 and 43 of the impedance matching unit 40 function as a pull-up portion and a pull-down portion, respectively. Also, each of the variable impedance circuits 41 and 43 of the impedance matching unit 40 has the same configuration as the variable impedance circuit 11 of the impedance calibration unit 10 and has an impedance value corresponding to the impedance control code "code".

The operation of the conventional impedance calibration circuit shown in FIG. 1 will now be described.

In general, the resistors R10 and R20 of the reference voltage generation unit 30 have the same resistance. Thus, the reference voltage generation unit 30 outputs a reference voltage Vref having a half level of the power supply voltage Vdd. The comparison unit 20 compares the voltage VZQ at the terminal ZQ with the reference voltage Vref and outputs a control signal "con". When calibration impedance (i.e., the impedance of the variable impedance circuit 11 of the impedance calibration unit 10) is higher than the impedance of the reference resistor RQ, the voltage VZQ at the terminal ZQ becomes lower than the reference voltage Vref, so that the comparison unit 20 outputs a low-level control signal "con".

When the calibration impedance is lower than the impedance of the reference resistor RQ, the voltage VZQ at the terminal ZQ becomes higher than the reference voltage Vref, so that the comparison unit 20 outputs a high-level control signal "con". The control code generator 13 of the impedance calibration unit 10 varies the impedance control code "code" in response to the control signal "con" and outputs the varied code to the variable impedance circuit 11. That is, the control code generator 13 of the impedance calibration unit 10 decreases the impedance control code "code" in response to the low-level control signal "con", while the control code generator 13 of the impedance calibration unit 10 increases the impedance control code "code" in response to the high-level control signal "con".

As described above, the variable impedance circuit 11 has an impedance value corresponding to the impedance control code "code". Accordingly, when the low-level control signal "con" is input, the impedance control code "code" decreases, and thus the calibration impedance (i.e., the impedance of the variable impedance circuit 11) becomes low. Also, when the high-level control signal "con" is input, the impedance control code "code" increases, and thus the calibration impedance becomes high.

When the above-described operation is performed until the voltage VZQ at the terminal ZQ is equal to the reference voltage Vref, the calibration impedance becomes the same as the impedance of the reference resistor RQ. The control code generator 13 outputs the impedance control code "code" allowing the calibration impedance to be the same as the impedance of the reference resistor RQ to the impedance matching unit 40. For example, the control code generator 13 may initially output an impedance control code "code" with a small value, continuously vary impedance control codes "code", and output an impedance control code "code" with the greatest value among the continuously varied impedance control codes "code" to the impedance matching unit 40.

Each of the variable impedance circuits 41 and 43 of the impedance matching unit 40 has the same configuration as the variable impedance circuit 11 of the impedance calibration unit 10. Thus, when the same code as the impedance control code "code" input to the variable impedance circuit 11 is input to the variable impedance circuits 41 and 43, input/output impedance (i.e., the impedance of the variable impedance circuits 41 and 43) becomes the same as the calibration impedance (i.e., the impedance of the variable impedance circuit 11). The number of variable impedance circuits of the impedance matching unit 40 depends on the number of data input/output terminals DQ1.

However, in the conventional impedance calibration circuit shown in FIG. 1, there is no problem with the operation of the impedance calibration circuit, but there are some problems in testing a semiconductor device including the impedance calibration circuit.

Specifically, when testing a semiconductor device including the conventional impedance calibration circuit for reference resistors having different reference resistances, a plurality of reference resistors having different resistances should be installed at test equipment and a relay switch should be installed between the semiconductor device and each of the reference resistors. As a result, a large amount of testing space is required, and the number of semiconductor devices that can be tested at one time is reduced. In turn, it is difficult to mass-produce semiconductor devices at high efficiency. Consequently, even though semiconductor memory devices may use a reference resistance ranging from 120Ω to 360Ω, semiconductor memory devices are typically tested using a single reference resistance of 240Ω.

SUMMARY OF THE INVENTION

An embodiment of the invention provides an impedance calibration circuit with a variable reference voltage generation unit. The impedance calibration circuit maximizes the number of semiconductor devices that can be tested in test equipment at one time and permits the operation of an impedance matching unit (e.g., an on-die-termination (ODT) circuit and/or an off-chip-driver (OCD)) to be tested for a variety of reference resistor values.

An embodiment of the invention provides an impedance calibration circuit including: a reference voltage selection signal generation unit configured to receive a test mode signal and output a plurality of reference voltage selection signals; a reference voltage generation unit coupled to the reference voltage selection signal generation unit and configured to output a first reference voltage, the first reference voltage having a voltage level based on the plurality reference voltage selection signals; a comparison unit coupled to the reference voltage comparison unit and configured to compare the voltage level of the first reference voltage with a voltage level of a second reference voltage at an impedance calibration terminal, the comparison unit further configured to output a control signal based on the comparison; an impedance calibration unit coupled to the comparison unit and configured to output an impedance control code in response to the control signal, the impedance calibration unit further configured to generate a calibration impedance based on the impedance control code; and an impedance matching unit coupled to the impedance calibration unit and configured to adjust a circuit interface impedance in response to the impedance control code.

Another embodiment of the invention provides a semiconductor device. The semiconductor device includes: a memory cell array configured to store data; an impedance matching circuit coupled to the memory cell array, the impedance matching circuit having a plurality of variable impedance circuits, the impedance matching circuit coupled to a plurality of data terminals, each of the plurality of data terminals coupled to at least one of the plurality of variable impedance circuits; an impedance calibration unit coupled to the impedance matching circuit, the impedance calibration unit configured to output a first control signal to the impedance matching circuit based on a second control signal; and a comparison unit coupled to the impedance calibration unit and configured to output the second control signal to the impedance calibration unit based on a selected one of a plurality of reference voltages, each of the plurality of reference voltages associated with a corresponding one of a plurality of reference resistance values.

BRIEF DESCRIPTION OF THE DRAWINGS

The foregoing and other objects, features and advantages of the invention will be apparent from the more particular description of exemplary embodiments of the invention, as illustrated in the accompanying drawings. The drawings are not necessarily to scale, emphasis instead being placed upon illustrating the principles of the invention.

DETAILED DESCRPTION OF THE INVENTION

An impedance calibration circuit and a semiconductor device including the same according to the present invention will now be described more fully hereinafter with reference to the accompanying drawings, in which exemplary embodiments of the invention are shown.

Figure 2:
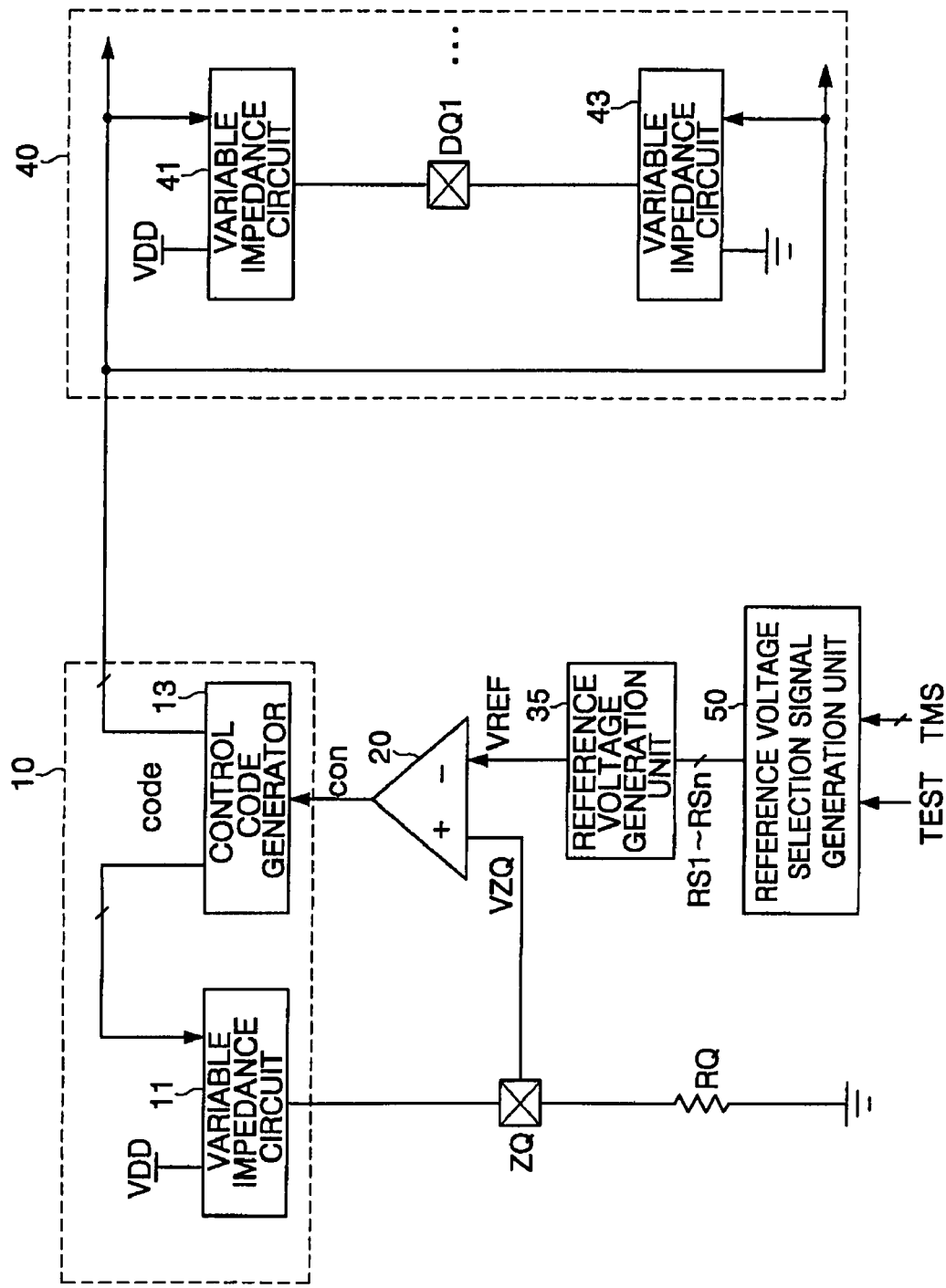
FIG. 2 is a block diagram of an impedance calibration circuit according to an exemplary embodiment of the present invention.

FIG. 2 is a block diagram of an impedance calibration circuit according to an exemplary embodiment of the present invention.

Referring to FIG. 2, the impedance calibration circuit includes an impedance calibration unit 10, a comparison unit 20, a reference voltage generation unit 35, an impedance matching unit 40, and a reference voltage selection signal generation unit 50. The impedance calibration unit 10 includes a variable impedance circuit 11 and a control code generator 13. The impedance matching unit 40 includes variable impedance circuits 41 and 43, which function as a pull-up portion and a pull-down portion, respectively. The number of variable impedance circuits of the impedance matching unit 40 depends on the number of data input/output terminals DQ1, and an on-die-termination (ODT) circuit or an off-chip-driver (OCD) circuit may be used as the impedance matching unit 40. In FIG. 2, reference character ZQ refers to an additional terminal for impedance calibration, DQ1 refers to a data input/output terminal, and RQ refers to a reference resistor.

Functions of the respective blocks shown in FIG. 2 will now be described.

Figure 1:
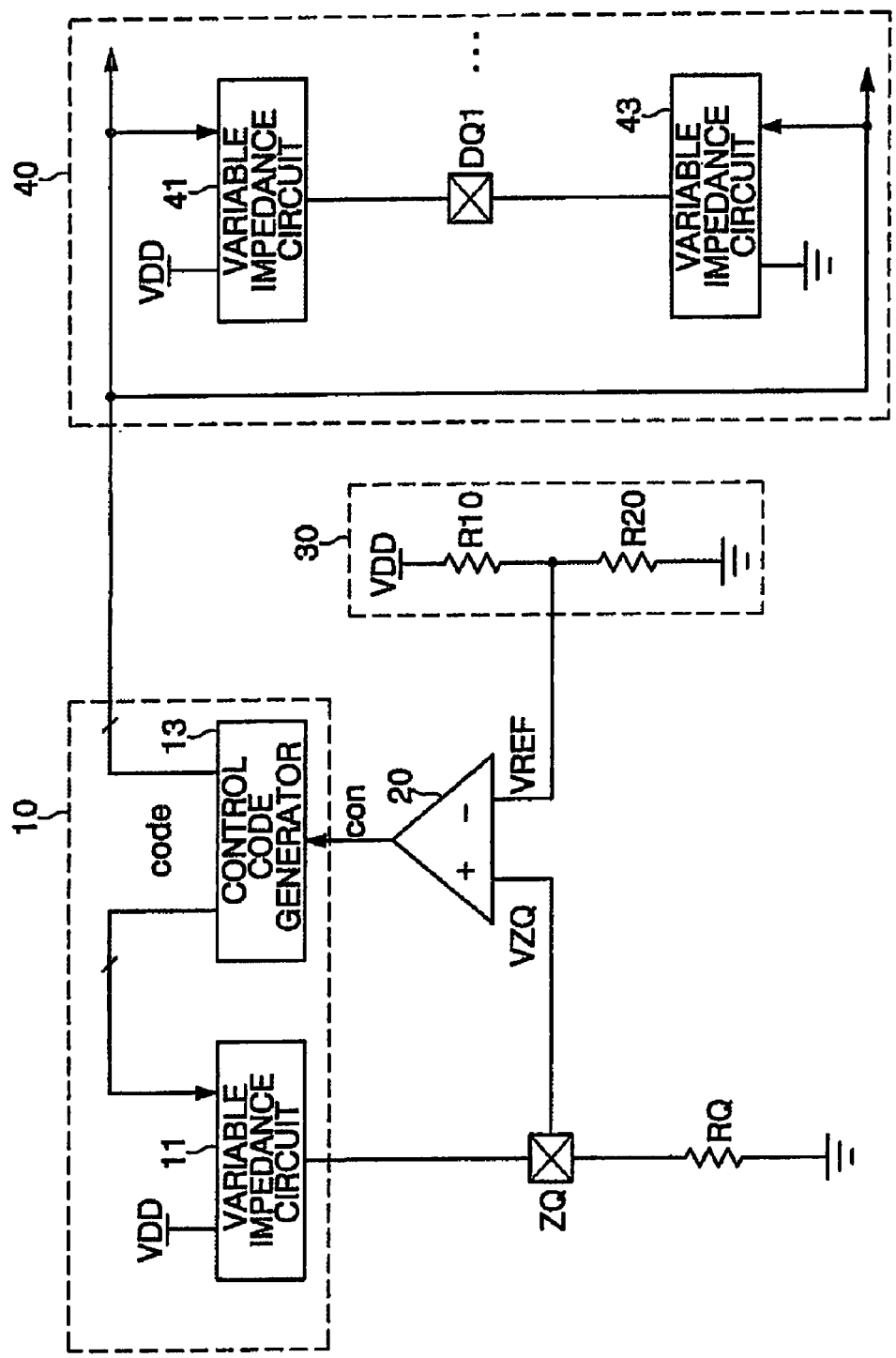
FIG. 1 is a block diagram of a conventional impedance calibration circuit.

The functions of the impedance calibration unit 10, the comparison unit 20, and the impedance matching unit 40 are the same as those described with reference to FIG. 1. Implementations of the impedance calibration unit 10, the comparison unit 20, and the impedance matching unit 40 may vary, however. For example, in an alternative embodiment, the impedance calibration unit may not include a control code generator 13 as illustrated in FIG. 1, and/or the impedance matching unit 40 may not include multiple pairs of pull-up and pull-down variable impedance circuits, according to design choice.

The reference voltage generation unit 35 outputs a reference voltage Vref having a voltage level corresponding to reference voltage selection signals RS1 to RSn in response to the reference voltage selection signals RS1 to RSn. The reference voltage selection signal generation unit 50 outputs the reference voltage selection signals RS1 to RSn in response to externally-applied test mode command TEST and test mode signal TMS.

The operation of the impedance calibration circuit shown in FIG. 2 will now be described.

In a normal operating mode, the reference voltage selection signal generation unit 50 outputs predetermined reference voltage selection signals RS1 to RSn such that a reference voltage Vref reaches a predetermined level (e.g., ½ the level of a power supply voltage Vdd) in response to the test mode command TEST. In a test mode, the reference voltage selection signal generation unit 50 outputs reference voltage selection signals RS1 to RSn having various logic combinations in response to the test mode command TEST and the test mode signal TMS. The reference voltage generation unit 35 outputs the reference voltage Vref having a voltage level based on the reference voltage selection signals RS1 to RSn.

The comparison unit 20 compares a voltage VZQ at the terminal ZQ with the reference voltage Vref and outputs a control signal "con". The impedance calibration unit 10 varies the impedance control code "code" in response to the control signal "con" and calibrates calibration impedance (i.e., the impedance of the variable impedance circuit 11). When the reference voltage Vref is at a higher level than ½ the level of the power supply voltage Vdd, the calibration impedance (i.e. the impedance of the variable impedance circuit 11 of the impedance calibration unit 10) is adjusted to a lower value than the impedance of the reference resistor RQ. That is, as compared with the case where the reference voltage Vref has ½ the level of the power supply voltage Vdd, the impedance calibration unit 10 operates in the same manner as when a reference resistor RQ having lower impedance is connected to the terminal ZQ. When the reference voltage Vref is at a lower level than ½ the level of the power supply voltage Vdd, the calibration impedance is adjusted to a higher value than the impedance of the reference resistor RQ. That is, as compared with the case where the reference voltage Vref has ½ the level of the power supply voltage Vdd, the impedance calibration unit 10 operates in the same manner as when a reference resistor RQ having higher impedance is connected to the terminal ZQ.

The impedance calibration unit 10 outputs an impedance control code "code" for allowing the calibration impedance to be the same as the impedance of the reference resistor RQ to the impedance matching unit 40. Therefore, as described with reference to FIG. 1, the input/output impedance of the impedance matching unit 40 (e.g., the impedance of the variable impedance circuits 41 and 43) has the same value as the calibration impedance (i.e., the impedance of the variable impedance circuit 11 of the impedance calibration unit 10).

In other words, the impedance calibration circuit shown in FIG. 2 may output the reference voltage Vref at various levels in response to the test mode command TEST and the test mode signal TMS in a test mode. Therefore, the impedance calibration circuit can operate using one reference resistor RQ in the same manner as when the reference resistor RQ has different impedances.

Figure 3:
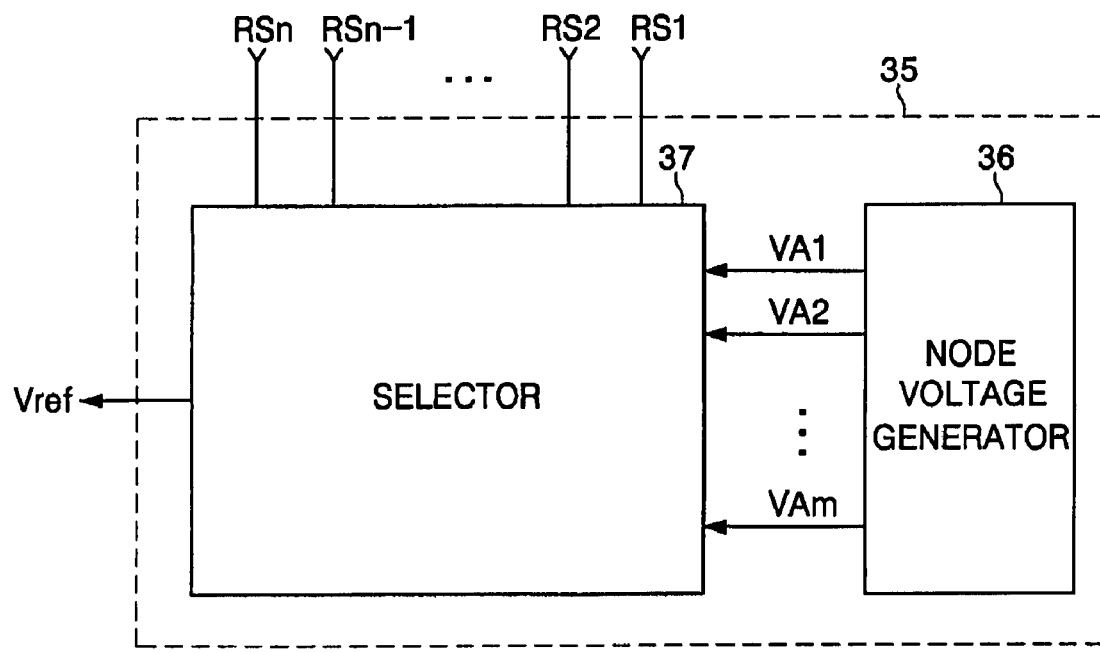
FIG. 3 is a block diagram of a reference voltage generation unit of the impedance calibration circuit shown in FIG. 2, according to an embodiment of the invention.

FIG. 3 is a block diagram of the reference voltage generation unit 35 of the impedance calibration circuit shown in FIG. 2, according to an embodiment of the invention.

Referring to FIG. 3, the reference voltage generation unit 35 includes a node voltage generator 36 coupled to a selector 37.

Functions of the respective blocks shown in FIG. 3 will now be described.

The node voltage generator 36 outputs a plurality of node voltages VA1 to VAm. For example, the node voltage generator 36 may be a voltage divider including a plurality of resistors that are connected in series between a power supply voltage and a ground voltage. In this case, each of the node voltages VA1 to VAm is a voltage at a node between adjacent resistors.

The selector 37 outputs one of the node voltages VA1 to VAm as a reference voltage Vref in response to reference voltage selection signals RS1 to RSn output from the reference voltage selection signal generation unit 50.

That is, the node voltage generator 36 outputs the node voltages VA1 to VAm having different voltage levels, and the selector 37 outputs one of the node voltages VA1 to VAm as the reference voltage Vref in response to the reference voltage selection signals RS1 to RSn.

Figure 4:
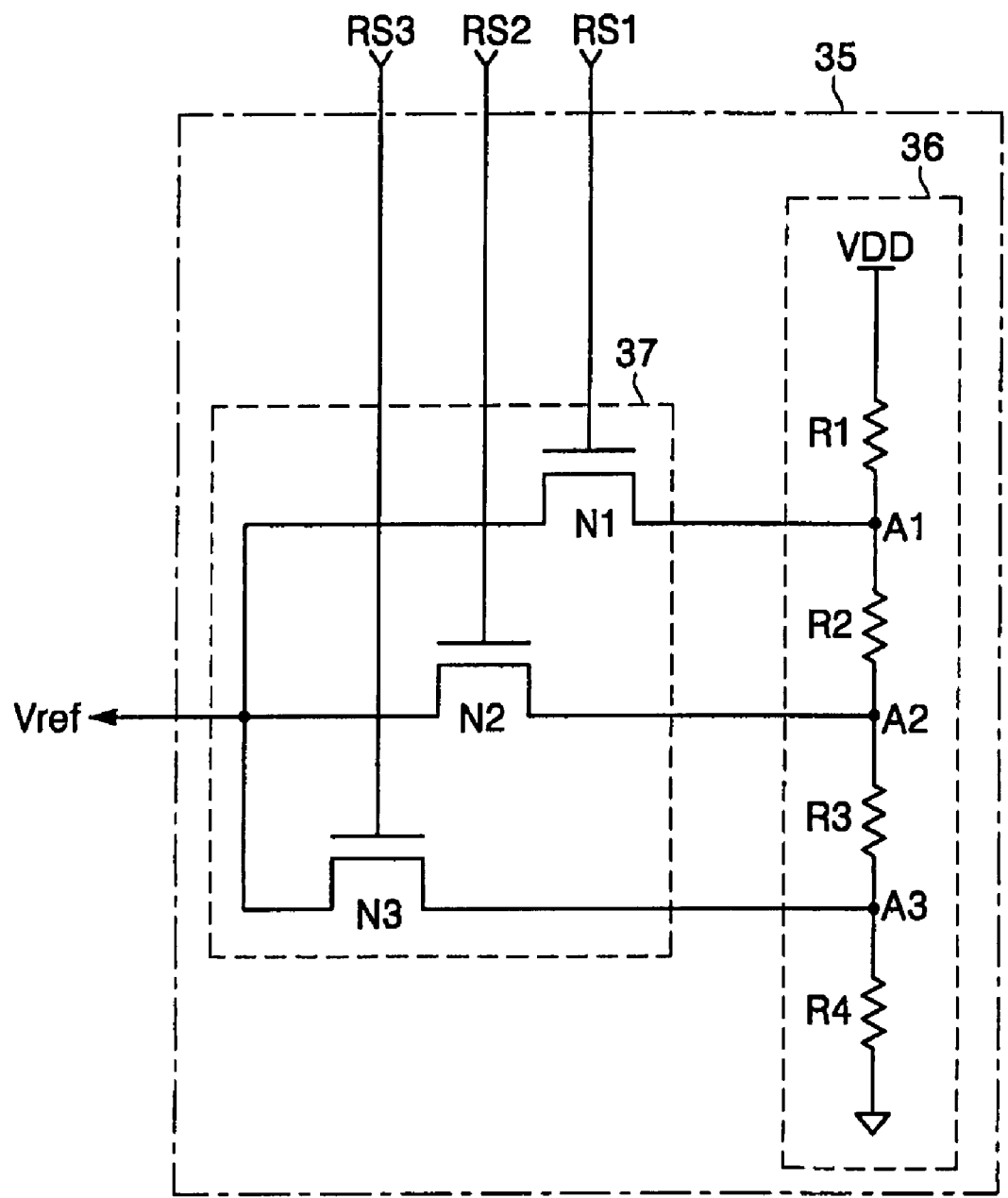
FIG. 4 is a circuit diagram of the reference voltage generation unit of the impedance calibration circuit shown in FIG. 3, according to an embodiment of the invention.

FIG. 4 is a circuit diagram of the reference voltage generation unit 35 of the impedance calibration circuit shown in FIG. 3, according to an embodiment of the invention.

Referring to FIG. 4, the node voltage generator 36 may include four resistors R1 to R4 that are connected in series between a power supply voltage Vdd and a ground voltage. Also, the selector 37 may include three NMOS transistors N1 to N3, each of which is connected between corresponding one of nodes A1 to A3, which are respectively located between adjacent resistors R1 to R4, and a node from which the reference voltage Vref is output. Also, each of the NMOS transistors N1 to N3 is turned on and off in response to the corresponding one of the reference voltage selection signals RS1 to RS3. In FIG. 4, it is exemplarily illustrated that the selector 37 includes NMOS transistors. However, the present invention is not limited thereto and the selector 37 may alternatively include other types of switching circuits that are turned on and off in response to input signals.

The operation of the reference voltage generation unit 35 shown in FIG. 4 will now be described.

In general, a semiconductor memory device may use reference resistances of 120Ω, 240Ω, or 360Ω. In testing the semiconductor memory device, when test equipment connected to the terminal ZQ has a reference resistance of 240Ω, the resistances of the resistors R1 to R4 may be determined such that a resistance ratio of R1:(R2+R3+R4) at the node A1 is 1:2, a resistance ratio of (R1+R2):(R3+R4) at the node A2 is 1:1, and a resistance ratio of (R1+R2+R3): R4 at the node A3 is 3:2. Thus, the semiconductor device may be tested using only a reference resistor RQ of 240Ω in conditions of all reference resistances of 120Ω, 240Ω, and 360Ω.

Specifically, when a resistance ratio of R1:R2:R3:R4 is 10:5:3:12, the resistance ratios at the respective nodes A1 to A3 reach the above-described values, the voltage at the node A1 is ⅔ the level of the power supply voltage Vdd, the voltage at the node A2 is ½ the level of the power supply voltage Vdd, and the voltage at the node A3 is ⅖ the level of the power supply voltage Vdd. When the reference resistor RQ having a resistance of 240Ω is connected to the terminal ZQ, and it is intended that the operation of the impedance calibration circuit should be tested in a condition that a reference resistance is 120Ω, the reference voltage selection signal RS1 is applied at a high level, while the remaining reference voltage selection signals RS2 and RS3 are applied at a low level. Then, the NMOS transistor N1 is turned on and the NMOS transistors N2 and N3 are turned off, so that the reference voltage Vref has ⅔ the voltage level of the power supply voltage Vdd.

Therefore, the impedance calibration circuit calibrates the impedance of the variable impedance circuit 11 of the impedance calibration unit 10 until the voltage at the terminal ZQ reaches ⅔ the level of the power supply voltage Vdd. As a result, the impedance of the variable impedance circuit 11 is calibrated to 120Ω. Similarly, when it is intended that the operation of the impedance calibration circuit should be tested in a condition that a reference resistance is 240Ω, the reference voltage selection signal RS2 is applied at a high level and the remaining reference voltage selection signals RS1 and RS3 are applied at a low level. Also, when it is intended that the operation of the impedance calibration circuit should be tested in a condition that a reference resistance is 360Ω, the reference voltage selection signal RS3 is applied at a high level and the remaining reference voltage selection signals RS1 and RS2 are applied at a low level.

Figure 5:
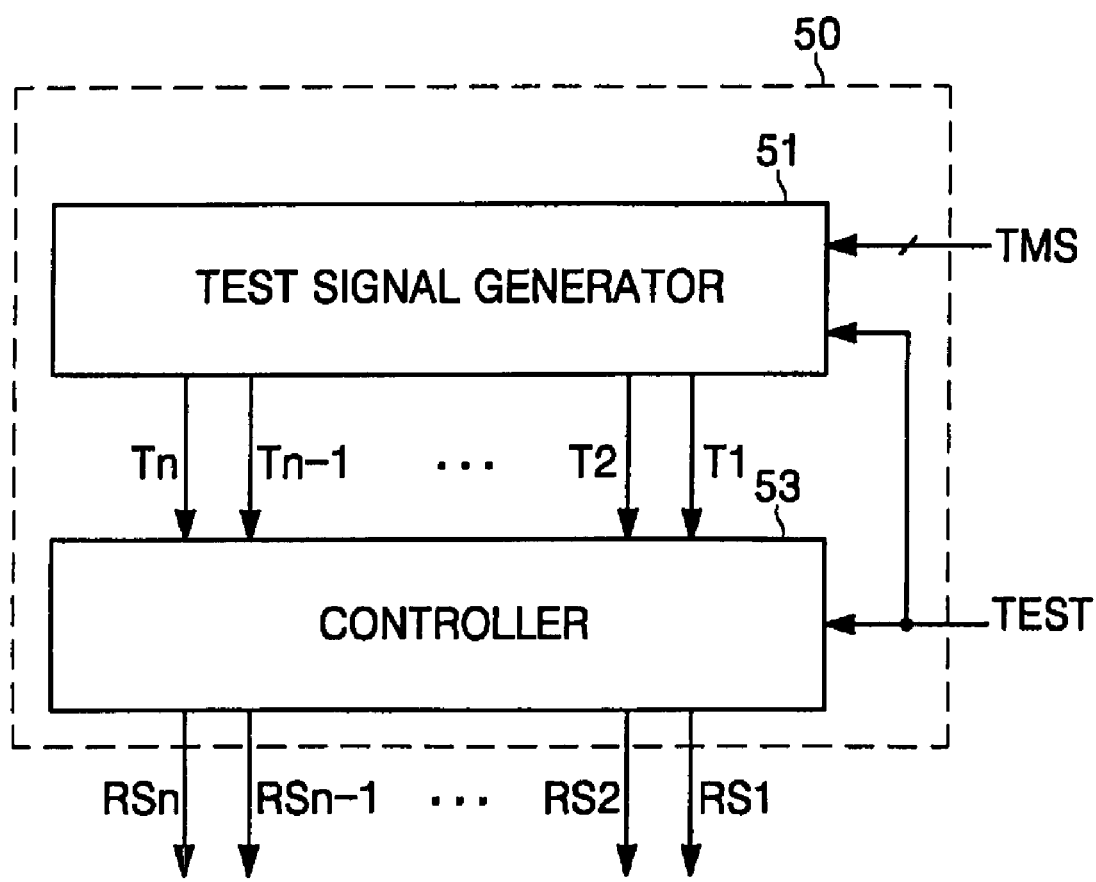
FIG. 5 is a block diagram of a reference voltage selection signal generation unit of the impedance calibration circuit shown in FIG. 2, according to an embodiment of the invention.

FIG. 5 is a block diagram of the reference voltage selection signal generation unit of the impedance calibration circuit shown in FIG. 2, according to an embodiment of the invention.

Referring to FIG. 5, the reference voltage selection signal generation unit 50 includes a test signal generator 51 coupled to a controller 53.

Functions and operations of the respective blocks shown in FIG. 5 will now be described.

The test signal generator 51 outputs a plurality of test signals T1 to Tn in response to the externally applied test mode command TEST and test mode signal TMS. The test signal generator 51 may include a test mode resistor set. In this case, the test mode resistor set outputs data corresponding to the test mode signal TMS among stored data as the test signals T1 to Tn in response to the test mode command TEST.

The controller 53 outputs reference voltage selection signals RS1 to RSn in response to the test mode command TEST and the test signals T1 to Tn. Specifically, the controller 53 may output predetermined reference voltage selection signals RS1 to RSn (e.g., reference voltage selection signals for outputting the reference voltage Vref having ½ the level of the power supply voltage Vdd) in response to the test mode command TEST in a normal operating mode, while the controller 53 may output the test signals T1 to Tn as the reference voltage selection signals RS1 to RSn in response to the test mode command TEST in a test mode.

Figure 6:
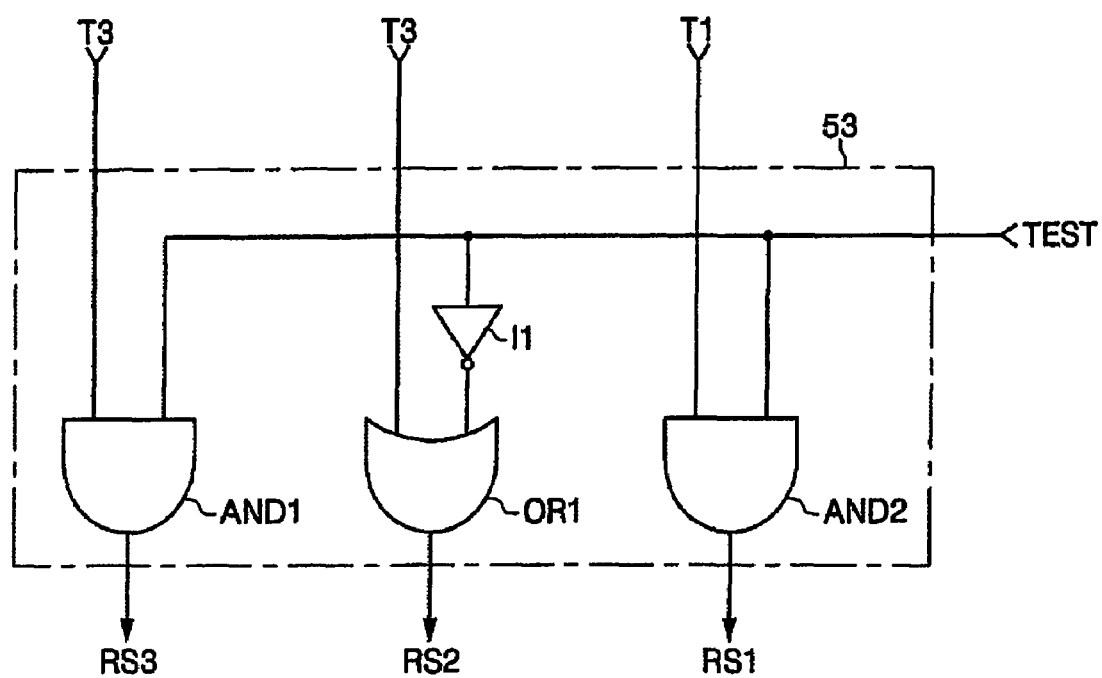
FIG. 6 is a circuit diagram of a controller of the reference voltage selection signal generation unit shown in FIG. 5, according to an embodiment of the invention.

FIG. 6 is a circuit diagram of the controller 53 of the reference voltage selection signal generation unit 50 shown in FIG. 5, according to an embodiment of the invention. FIG. 6 illustrates a case where the reference voltage generation unit 35 has the same configuration as illustrated in FIG. 4. As illustrated in FIG. 6, the controller 53 may include two AND gates (AND1 and AND2), an OR gate (OR1), and an inverter I1.

The operation of the controller 53 shown in FIG. 6 will now be described.

In a normal operating mode, a low-level test mode command TEST is input to the controller 53. Thus, the reference voltage selection signal RS2 always remains at a high level in the normal operating mode, while the reference voltage selection signals RS1 and RS3 always remain at a low level in the normal operating mode. In other words, the controller 53 receives the low-level test mode command TEST and outputs predetermined reference voltage selection signals RS1 to RS3. Therefore, in the normal operating mode, the reference voltage generation unit 35 always outputs a reference voltage Vref with a predetermined level. For example, when the reference voltage generation unit 35 has the same configuration as that illustrated in FIG. 4, the reference voltage Vref has ½ the level of the power supply voltage Vdd.

In a test mode, a high-level test mode command TEST is input to the controller 53. Thus, the reference voltage selection signals RS1 to RS3 have the same values as the test signals T1 to T3 output from the test signal generator 51. As stated above, the test signal generator 51 may be a test mode resistor set and output the test signals T1 to T3 having various configurations in response to the test mode command TEST and the test mode signal TMS. Therefore, in the test mode, the controller 53 may output the test signals T1 to T3 having various configurations, and the reference voltage generator 35 may output a reference voltage Vref that is based on the reference voltage selection signals RS1 to RS3.

For instance, in a case where the reference voltage generator 35 has the same configuration as that illustrated in FIG. 4, when the reference voltage selection signal RS1 is applied at a high level and the remaining reference voltage selection signals RS2 and RS3 are applied at a low level, the reference voltage Vref has ⅔ the level of the power supply voltage Vdd. Similarly, when only the reference voltage selection signal RS2 is applied at a high level, the reference voltage Vref has ½ the level of the power supply voltage Vdd; and when only the reference voltage selection signal RS3 is applied at a high level, the reference voltage Vref has ⅖ the level of the power supply voltage Vdd.

That is, the impedance calibration circuit of the present invention outputs the reference voltage selection signals RS1 to RS3 in response to the test mode command TEST and the test mode signal TMS in the test mode so that the level of the reference voltage Vref can be adjusted. Thus, even if only one reference resistor is connected to the terminal ZQ, the operations of the impedance calibration circuit can be tested for various reference resistances.

Figure 7:
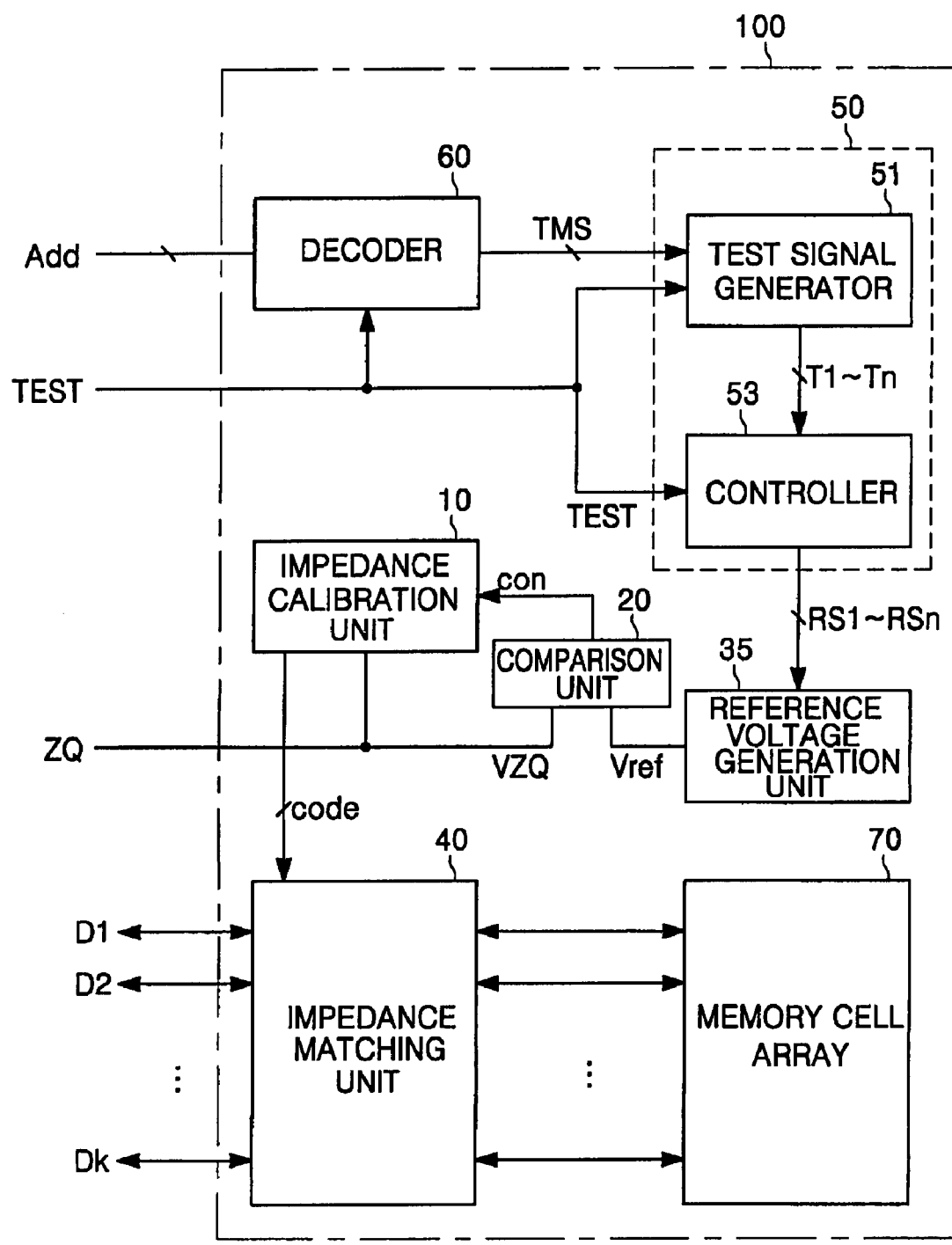
FIG. 7 is a block diagram of a semiconductor device including an impedance calibration circuit according to an exemplary embodiment of the present invention.

FIG. 7 is a block diagram of a semiconductor device including an impedance calibration circuit according to an exemplary embodiment of the present invention.

Referring to FIG. 7, a semiconductor device 100 includes an impedance calibration unit 10, a comparison unit 20, a reference voltage generation unit 35, an impedance matching unit 40, a reference voltage selection signal generation unit 50, a decoder 60, and a memory cell array 70. The reference voltage selection signal generation unit 50 includes a test signal generator 51 and a controller 53. The impedance matching unit 40 may be an ODT circuit or an OCD circuit.

Functions of the respective blocks shown in FIG. 7 will now be described.

The functions of the impedance calibration unit 10, the comparison unit 20, the reference voltage generation unit 35, the impedance matching unit 40, and the reference voltage selection signal generation unit 50 and the functions of the test signal generator 51 and the controller 53 of the reference voltage selection signal generation unit 50 may be the same as described with reference to FIGS. 2 through 6.

The decoder 60 decodes an externally-applied address signal Add in response to an externally-applied test mode command TEST and outputs a test mode signal TMS. The memory cell array 70 outputs data stored therein through the impedance matching unit 40 (i.e., the OCD circuit) in response to a read command or writes data signals D1 to Dk input through the impedance matching unit 40 (i.e., the ODT circuit) in response to a write command.

Therefore, in a test mode, the semiconductor device shown in FIG. 7 according to the present invention decodes the address signal Add in response to the externally applied test mode command TEST to generate the test mode signal TMS, generates appropriate reference voltage selection signals RS1 to RSn in response to the test mode command TEST and the test mode signal TMS, and generates a reference voltage Vref that is based on the reference voltage selection signals RS1 to RSn.

In conclusion, according to the present invention, the impedance calibration circuit and the semiconductor device including the same can generate a reference voltage Vref having various voltage levels, compare the reference voltage Vref with the voltage VZQ at the terminal ZQ, and calibrate the impedance of the impedance calibration circuit in the test mode. Thus, even if the reference resistor RQ connected to the terminal ZQ has a fixed resistance, the operations of the impedance calibration circuit can be tested for various reference resistances and thus, the operations of the ODT circuit and/or OCD circuit can also be tested.

According to the present invention as described above, an impedance calibration circuit and a semiconductor device including the same can test the operation of the impedance calibration circuit using only one resistor. As a result, the number of semiconductor devices that can be tested at one time can be maximized. Also, even if only one resistor is connected to a terminal required for impedance calibration, the operations of the impedance calibration circuit can be tested for various resistances.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An impedance calibration circuit comprising:
    a reference voltage selection signal generation unit configured to receive a test mode signal and output a plurality of reference voltage selection signals;
    a reference voltage generation unit coupled to the reference voltage selection signal generation unit and configured to output a first reference voltage, the first reference voltage having a voltage level based on the plurality reference voltage selection signals;
    a comparison unit coupled to the reference voltage comparison unit and configured to compare the voltage level of the first reference voltage with a voltage level of a second reference voltage at an impedance calibration terminal, the comparison unit further configured to output a control signal based on the comparison;
    an impedance calibration unit coupled to the comparison unit and configured to output an impedance control code in response to the control signal, the impedance calibration unit further configured to generate a calibration impedance based on the impedance control code; and
    an impedance matching unit coupled to the impedance calibration unit and configured to adjust a circuit interface impedance in response to the impedance control code.

2. The circuit according to claim 1, wherein the reference voltage generation unit comprises:
    a node voltage generator configured to output a plurality of node voltages; and
    a selector coupled to the node voltage generator and configured to output a selected one of the plurality of node voltages as the first reference voltage in response to the plurality of reference voltage selection signals.

3. The circuit according to claim 2, wherein the node voltage generator comprises a plurality of resistors that are connected in series between a power supply voltage and the ground voltage, and each of the node voltages is a voltage at a node between adjacent pairs of the plurality of resistors.

4. The circuit according to claim 2, wherein the selector comprises a plurality of switching circuits, each of the plurality of switching circuits connected between a first terminal associated with a corresponding one of the plurality of node voltages and a second terminal associated with the first reference voltage.

5. The circuit according to claim 4, wherein each of the switching circuits includes an NMOS transistor having a gate coupled to a corresponding one of the plurality of reference voltage selection signals.

6. The circuit according to claim 1, wherein the reference voltage selection signal generation unit comprises:
    a test signal generator configured to output a plurality of test signals in response to a test mode command and the test mode signal; and a controller coupled to the test signal generator and configured to output the plurality of reference voltage selection signals in response to the test mode command and the plurality of test signals.

7. The circuit according to claim 6, wherein the test signal generator includes a test mode resistor set.

8. The circuit according to claim 1, wherein the impedance calibration unit includes:
   a control code generator coupled to receive the control signal and configured to output the impedance control code; and
   a variable impedance circuit coupled to the control code generator and configured to generate the calibration impedance.

9. The circuit according to claim 1, wherein the impedance matching unit includes:
   a first variable impedance circuit coupled to receive the control code and a supply voltage; and
   a second variable impedance circuit coupled to receive the control code and the ground voltage, the first variable impedance matching circuit coupled to the second variable impedance matching circuit at a data terminal, the first variable impedance circuit being a pull-up portion of the impedance matching unit and the second variable impedance circuit being a pull-down portion of the impedance matching unit.

10. The circuit according to claim 1, wherein the impedance matching unit is an on-die-termination (ODT) circuit.

11. The circuit according to claim 1, wherein the impedance matching unit is an off-chip-driver (OCD).

12. A semiconductor device comprising:
   a memory cell array configured to store data;
   an impedance matching circuit coupled to the memory cell array, the impedance matching circuit having a plurality of variable impedance circuits, the impedance matching circuit coupled to a plurality of data terminals, each of the plurality of data terminals coupled to at least one of the plurality of variable impedance circuits;
   an impedance calibration unit coupled to the impedance matching circuit, the impedance calibration unit configured to output a first control signal to the impedance matching circuit based on a second control signal; and
   a comparison unit coupled to the impedance calibration unit and configured to output the second control signal to the impedance calibration unit based on a selected one of a plurality of reference voltages, each of the plurality of reference voltages associated with a corresponding one of a plurality of reference resistance values.

13. The semiconductor device of claim 12, further comprising a reference voltage generation unit coupled to the comparison unit and configured to output the selected one of the plurality of reference voltages based on a plurality of selection signals.

14. The semiconductor device of claim 13, wherein the reference voltage generation unit includes:
   a node voltage generator configured to output a plurality of node voltages; and
   a selector coupled to the node voltage generator and configured to output a selected one of the plurality of node voltages as the first reference voltage in response to the plurality of reference voltage selection signals.

15. The semiconductor device of claim 14, wherein the node voltage generator comprises a plurality of resistors that are connected in series between a power supply voltage and the ground voltage, and each of the node voltages is a voltage at a node between adjacent pairs of the plurality of resistors.

16. The semiconductor device of claim 14, wherein the selector comprises a plurality of switching circuits, each of the plurality of switching circuits connected between a first terminal associated with a corresponding one of the plurality of node voltages and a second terminal associated with the first reference voltage.

17. The semiconductor device of claim 16, wherein each of the switching circuits includes an NMOS transistor having a gate coupled to a corresponding one of the plurality of reference voltage selection signals.

18. The semiconductor device of claim 13, further comprising a selection signal generation unit coupled to the reference voltage generation unit and configured to output the plurality of selection signals based on a test mode command and a test mode signal.

19. The semiconductor device of claim 18, wherein the selection signal generation unit includes:
   a test signal generator configured to output a plurality of test signals in response to a test mode command and the test mode signal; and
   a controller coupled to the test signal generator and configured to output the plurality of selection signals in response to the test mode command and the plurality of test signals.

20. The semiconductor device of claim 18, further comprising a decoder coupled to the selection signal generation unit and configured to output the test mode signal to the selection signal generation unit based on a received address and the test mode command.

* * * * *